(12) United States Patent
Reeves

(10) Patent No.: US 6,456,081 B1
(45) Date of Patent: Sep. 24, 2002

(54) HOLIDAY LIGHT TESTER

(76) Inventor: Michael Reeves, 422 W. Broadway, Bradley, IL (US) 60915

( * ) Notice: Subject to any disclaimer, the term of this patent is extended or adjusted under 35 U.S.C. 154(b) by 23 days.

(21) Appl. No.: 09/696,300

(22) Filed: Oct. 26, 2000

(51) Int. Cl.[7] .............................................. G01R 31/00
(52) U.S. Cl. ...................................................... 324/414
(58) Field of Search ................... 324/414, 133, 324/537, 555, 556, 122

(56) References Cited

U.S. PATENT DOCUMENTS

| | | | |
|---|---|---|---|
| 5,008,626 A | * | 4/1991 | Boyd, Sr. ............... 324/133 |
| 5,047,721 A | | 9/1991 | Farley |
| 5,179,339 A | | 1/1993 | Volk, Jr. |
| 5,319,312 A | | 6/1994 | Segilia |
| 5,369,363 A | | 11/1994 | Hey |
| 5,539,317 A | | 7/1996 | Janning |
| 5,604,436 A | | 2/1997 | Henritzy et al. |

\* cited by examiner

*Primary Examiner*—N. Le
*Assistant Examiner*—J Kerveros
(74) *Attorney, Agent, or Firm*—Siemens Patent Services LC

(57) ABSTRACT

Testing apparatus for testing string lamps such as hose of Christmas lights. The apparatus includes a hand held housing having two sockets for testing lamps, an indicating lamp, and a buzzer. One socket connects power from a battery to the electrodes of the lamp. The other socket is associated with an inductive circuit which energizes the indicating lamp and buzzer when the inserted lamp is operable. Externally exposed electrodes connected to the indicating lamp and buzzer enable testing of fuses. Internal circuitry includes a 4069 chip containing a plurality of individual amplifiers.

8 Claims, 2 Drawing Sheets

HOLIDAY LIGHT TESTER

BACKGROUND OF THE INVENTION

1. Field of the Invention

The present invention relates to an instrument for testing electric lamps, more particularly linear arrays of lamps. The novel instrument determines presence of burned out lamp filaments and open circuits in lamp arrays. The invention may be utilized by ordinary consumers and by maintenance and installation personnel to analyze operative status of Christmas lights and other linear arrays of lamps.

2. Description of the Prior Art

Most occupants of households, offices, and other living and working spaces who celebrate holidays such as Christmas and New Years Day in part by adorning structures and plants with linear arrays of lamps, hereinafter referred to as light strings, reuse light strings year after year. Over time, some of the individual lamps become inoperable due to filament failure or breakage of conductors conducting electrical power. Lamps can usually be easily replaced. Lamp replacement is less expensive than replacing a string of lights.

When one lamp fails, depending upon the circuitry of the light string, all lamps fail to illuminate or alternatively, the affected lamp fails. It is an easy matter to remove a lamp and connect it to appropriate electrical power, then to observe the results. The prior art has proposed testers designed to test individual lamps to facilitate repair of faulty light strings. An example is seen in U.S. Pat. No. 5,047,721, issued to Earl T. Farley on Sep. 10, 1991. Farley utilizes amplified capacitive discharge to determine whether an operable or defective lamp has been inserted into his tester, requiring a much more complicated circuit than does the present invention, and provides for only one type of test. The present invention offers two possible tests for each lamp being tested. Farley tests lamps in situ, i.e., with lamps connected to their associated light string. In the present invention, lamps are removed for insertion into the tester.

U.S. Pat. No. 5,179,339, issued to Robert C. Volk, Jr. on Jan. 12, 1993, describes a tester comprising a power supply which can be connected to each lamp in situ. A probe having two electrodes connects each lamp to power. If the lamp being tested is good, it illuminates when connected. By contrast, the present invention provides two tests. In one test, which connects power to the lamp being tested, the lamp is removed from the string and inserted into the tester. The lamp is inserted into the tester, albeit at a different location, for the other test.

U.S. Pat. No. 5,319,312, issued to Rocco F. Segilia on Jun. 7, 1994, sets forth a tester which is connected to a socket in the light string. The light string is thus divided into two legs. The tester of Segilia indicates which leg contains a problem area. The device of Segilia is subject to being inoperable if one lamp in each leg is defective. Progressive tests will eventually pinpoint the problem area by subdividing the leg indicated as having the defect. By contrast, lamps are removed individually and inserted into the novel tester. Segilia lacks the two tests offered by the present invention.

U.S. Pat. No. 5,369,363, issued to Bill L. Hey on Nov. 29, 1994, provides a device which extracts a lamp from its socket of the light string. The device has electrodes which apply power to the lamp. The lamp itself illuminates if it is operable when connected to power from the tester. By contrast, the present invention offers two different tests.

U.S. Pat. No. 5,539,317, issued to John L. Janning on Jul. 23, 1996, describes a tester which employs audio amplification of a field given off by a powered lamp inserted into the tester. The present invention does not use audio amplification, and in a further distinction offers two types of tests rather than one.

U.S. Pat. No. 5,604,436, issued to Charles L. Henritzy on Feb. 18, 1997, describes a tester wherein both the tester and the lights are powered when testing. The tester of Henritzy has a probe which inserted into the base of a lamp being tested to apply power thereto. Henritzy connects his tester to AC power, rather than having a battery, as does the present invention. Also, Henritzy offers but one type of test, whereas the present invention offers two different types of tests.

None of the above inventions and patents, taken either singly or in combination, is seen to describe the instant invention as claimed.

SUMMARY OF THE INVENTION

The present invention sets forth a tester for light strings which tests lamps individually, after they are removed from the string and inserted into the tester. The tester has two sockets for receiving each lamp, each socket providing a different type of test. This approach is considered superior to testing lamps en masse by the user since more than one lamps can fail in a string. Potentially, failure of plural lamps defeats some testing procedures, which must then be modified to test lamps one at a time. Another advantage of testing lamps individually is that such a procedure is equally applicable to different wiring schemes utilized with light strings.

It is possible that a test will result in a false reading. Providing two types of tests substantially improves chances of successfully detecting a faulty lamp. The tester is also inherently safe since it avoids connection of either the light string or of the tester itself to household AC power, which is typically 110 to 120 volts.

The tester is small and conveniently held in the hand. It has a light emitting diode and a buzzer as indicators. Power is supplied from battery cells contained in the tester. Preferably, the cells are AA size, which are inexpensive and readily available. Use of battery power rather than household AC power eliminates errors which may arise due to inappropriate polarity when connected to AC power. The circuitry of the novel tester is such that a lamp being tested need merely be inserted into one of the two available testing sockets formed in the housing.

Accordingly, it is one object of the invention to provide a hand held tester for testing lamps of a lighting string.

It is another object of the invention to offer two different tests for testing faults of a lamp.

It is a further object of the invention to avoid exposing the user to voltages of household power.

Still another object of the invention is to test lamps one by one.

An additional object of the invention is to provide both audible and visible annunciators.

Yet another object of the invention is to avoid problems which arise from inappropriate polarity in AC systems.

Still a further object of the invention is that the tester be applicable to all commonly utilized wiring schemes of light strings.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Various other objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENTS

Figure 1:
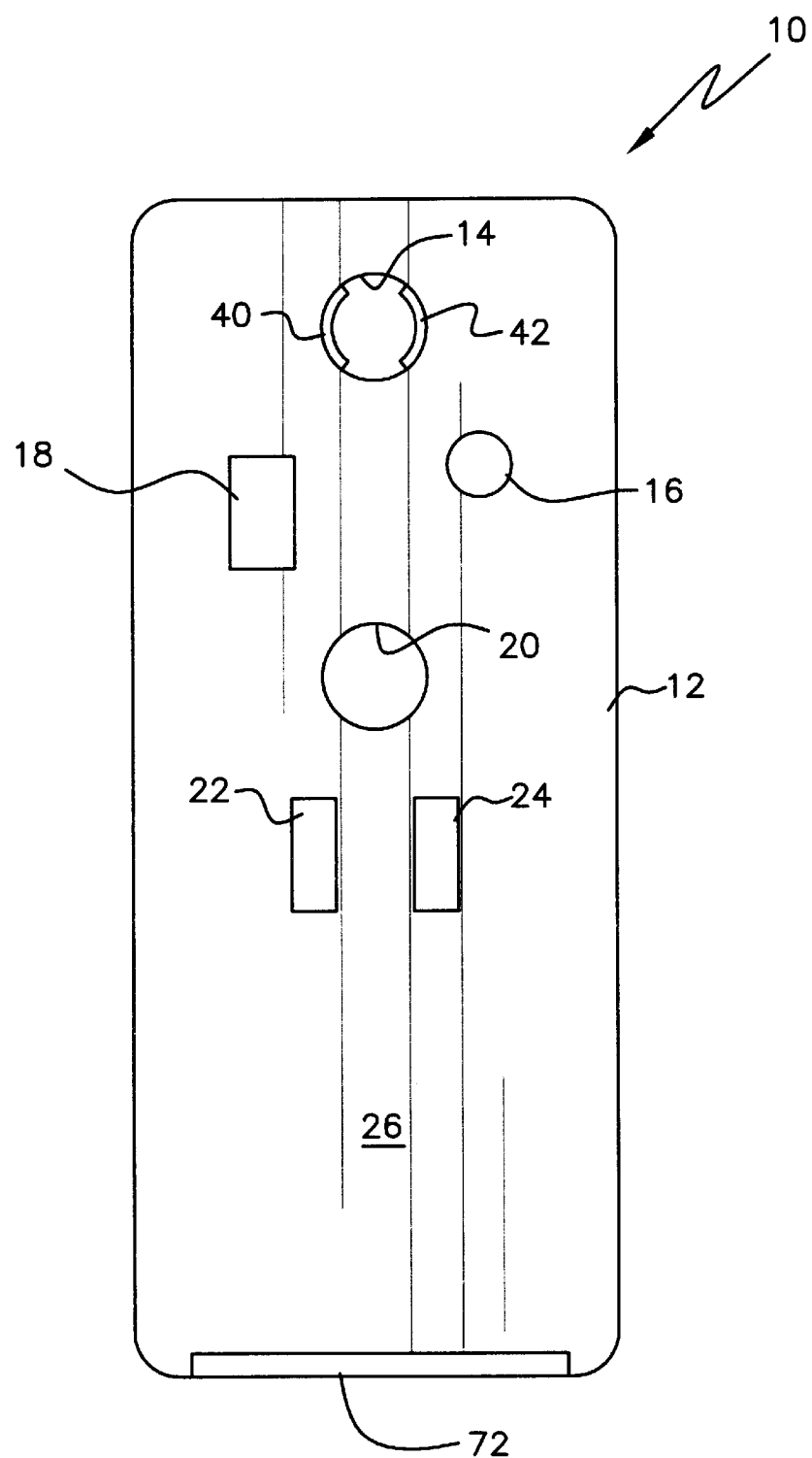
FIG. 1 is a front view of one embodiment of the apparatus of the invention.
Figure 2:
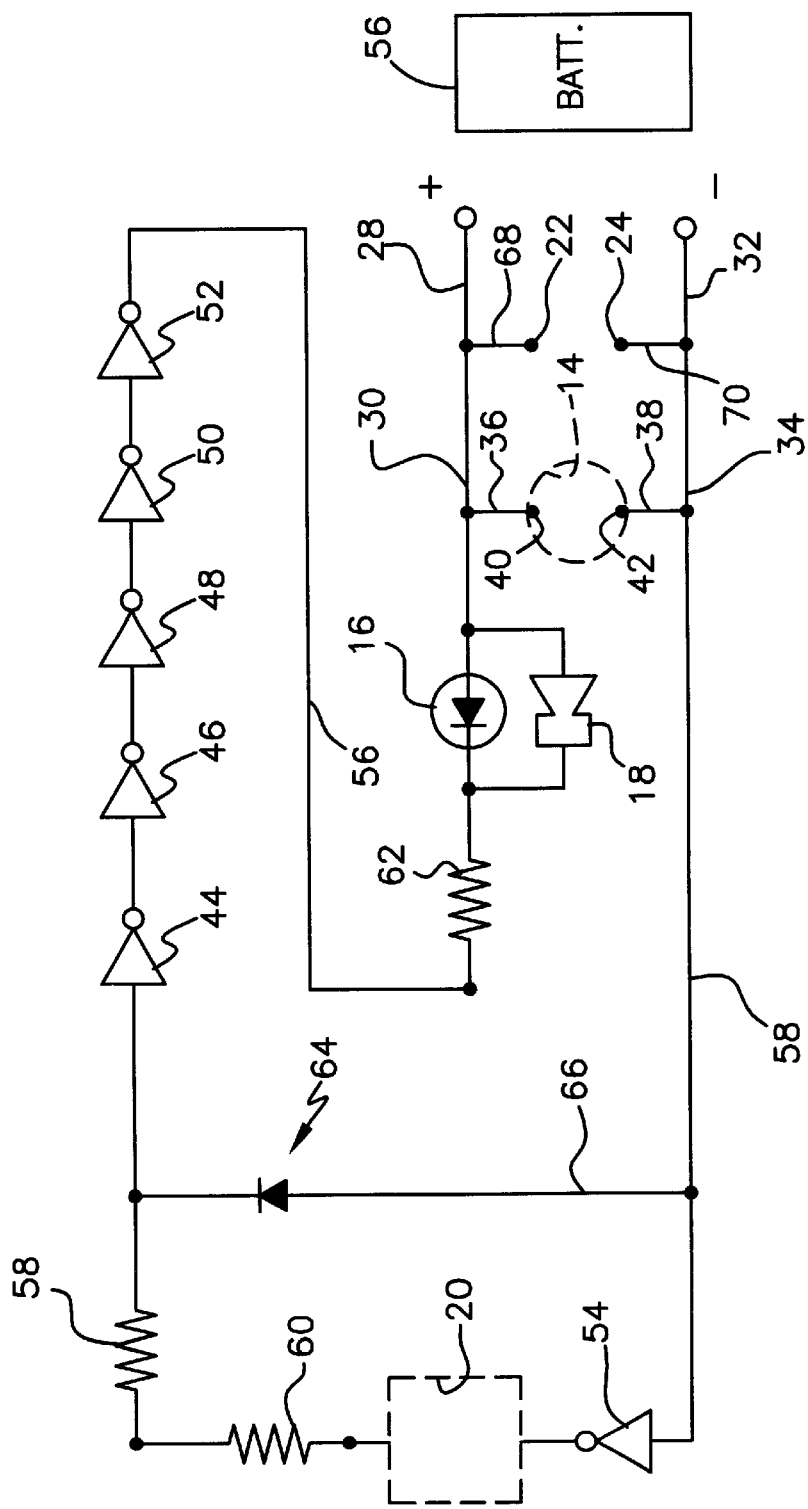
FIG. 2 is an electrical schematic showing circuitry of the apparatus of FIG. 1.

Turning now to FIG. 1 of the drawings, novel testing apparatus 10 is seen to comprise a housing 12 for containing circuitry and a battery (see FIG. 2). The exterior of housing 12 includes a first socket 14, annunciators including an LED indicating lamp 16 and a buzzer 18, a second socket 20, and first and second spaced apart electrodes 22, 24 exposed at the outer surface 26 of housing 12. Operability of lamps of lighting strings (not shown) is determined by inserting a lamp into either socket 14, socket 20, or both in successive tests. Sockets 14, 20 are accessible from the exterior of housing 12 so that lamps are readily placed therein for testing. Indicating lamp 16 and buzzer 18 operate to annunciate the operable status of a lamp placed into socket 20.

FIG. 2 shows circuitry which operates the annunciators responsive to insertion of a lamp into socket 14 or 20. A first subcircuit comprising conductor legs 28, 30, 32, 34, 36, 38 conducts power to electrodes 40, 42 contained and accessible to direct contact within socket 14. When a lamp is removed from its lighting string and placed into socket 14 such that its exposed electrodes contact electrodes 40, 42 of socket 14, that lamp will light if its filament is intact, thereby confirming operability of the tested lamp. Thus direct connection to electrical power constitutes a first test of a lamp which may be conducted.

A second test of a lamp is conducted by inserting the closed, visible glass end of the bulb into socket 20, with power applied to the lamp or its lighting string. A second subcircuit responds to a signal arising from the tested lamp. Power is amplified by amplifiers 44, 46, 48, 50, 52, 54, which amplify an inductive current established in the second subcircuit. Amplified current passes through legs 56, 58 of the second subcircuit, thereby energizing and operating LED 16 and buzzer 18.

A 4069 chip provides amplifiers 44, 46, 48, 50, 52 which are connected in series as shown in the exemplary circuitry of FIG. 2 by connecting appropriate terminals of the chip. Amplifier 54 is also provided by the 4069 chip. Battery 56 which supplies power to the circuitry preferably comprises AAA cells, although other commercially available cells, such as nine volt cells (not shown) may be utilized with appropriate adjustment to values of resistors 58, 60, 62. A diode 64 is placed in series in leg 66 of the circuitry to protect battery 56 from potential damage from backfeeding.

A third subcircuit is provided for testing fuses (not shown). The third subcircuit includes legs 28, 68 and 32, 70 of the depicted conductors. Leg 68 conducts power to electrode 22, and leg 70 conducts power to electrode 24. When exposed conductive elements of a fuse are placed in direct contact with electrodes 22, 24 from the exterior of housing 12, power will flow through LED 16 and buzzer 18, as occurs when electrodes 40, 42 are connected by insertion of a limp as described above.

OPERATION

Apparatus 10 is energized by placing battery 56 within a battery clip (not shown) contained within a battery compartment (shown symbolically by compartment door 72 in FIG. 1). Alternatively, a switch (not shown) may be provided to connect and disconnect battery 56 from the circuitry.

Operability tests on two-wire, three-wire, and five-wire lighting strings (none shown) may be conducted utilizing apparatus 10. To test a two-wire string, also known as a plug-in set, the two lamps at the end of the string are removed and are tested in socket 14. These are the two lamps most distant from the plug of the string. Defective lamps are to be replaced with operable lamps. The light string should light when defective lamps are replaced. Failure to light indicates at least one other faulty lamp. With only the last lamp removed from the light string, the second to last having being replaced in the string, the glass bulb of the second to last lamp is inserted into socket 20. Intermittent operation of the annunciators (e.g., flashing of LED 16) indicates operability of the lighting string. Constant operation of the annunciators may be caused by inappropriate polarity of the plug of the light string. This occurrence is corrected by reversing the plug in its household power receptacle. Subsequent intermittent operation of the annunciator confirms that polarity was the source of the problem.

If reversal of the plug fails to correct constant operation of the annunciators, then a faulty lamp has been identified. This lamp is replaced by a good lamp. The step of testing each lamp in socket 20 is continued until all lamps elicit intermittent operation of the annunciators. The lighting string should illuminate when all faulty lamps are replaced. If this does not occur then the testing procedure should be repeated to locate an unidentified faulty lamp.

Three-wire strings, also known as end-to-end strings, are tested in the following manner. The glass bulb of the last lamp of the string is inserted into socket 20. If the annunciators operate continuously, then polarity is corrected by reversing the plug in the household electrical receptacle. If the annunciators operate intermittently, then the next lamp is tested in the same manner as the first. If any lamp elicits continuous operation of the annunciators, then that lamp is determined to be faulty and is replaced by a good lamp. Replacement of faulty lamps will cause the string to illuminate. If no illumination occurs, then there remains at least one faulty lamp, which is located by repeating the test procedure.

Five-wire chasing light strings are tested in the following manner. Typically, this type of light string has lamps of four colors arranged in repeating patterns. Failure of one lamp typically causes of lamps of similar color to fail to illuminate. Therefore, testing need be conducted only on lamps of the affected color. Usually, this is every fourth lamp. The procedure is initiated by inserting the farthest affected lamp from the plug into socket 20. Intermittent operation of the annunciators confirms operability of the tested lamp. The next lamp is then tested. However, if the annunciators operate continuously, then polarity of the plug should be reversed as described prior. Intermittent operation of the annunciators should ensue. The remaining lamps of the affected color are successively tested in similar manner. Replacement of every faulty lamp should cause lamps of the affected color to illuminate. If illumination does not ensue, then the procedure should be repeated.

In some cases, all lamps of a five-wire chasing string are of one color. Every fourth lamp should be tested to assure that all lamps of any one string subcircuit have been tested.

The user may, at his or her discretion, utilize socket 14 to confirm operability of a lamp, although this requires removing the lamp from the string. The test utilizing socket 14 may be conducted with any style or variety of lighting string.

The present invention is susceptible to variations and modifications which may be introduced thereto without departing from the inventive concept. For example, either LED 16 or buzzer 18 may be utilized rather than both. The number of amplifiers and resistors may vary from the example depicted herein. Powered electrodes may be more exposed or recessed than represented herein.

It is to be understood that the present invention is not limited to the embodiments described above, but encompasses any and all embodiments within the scope of the following claims.

I claim:

1. Testing apparatus for determining operability of lamps for lighting strings, comprising:
    a housing for containing circuitry and a battery, said housing having a first socket and a second socket formed therein and accessible from the exterior of said housing, for receiving lamps for testing;
    a battery for supplying power;
    an annunciator for annunciating status of lamps being tested; and
    circuitry disposed to operate said annunciator, comprising a first subcircuit disposed to connect power from said battery to said first socket for direct contact with electrical conducting contact leads of a lamp, and a second subcircuit including a plurality of individual power amplifiers connected in series and disposed to establish an inductive circuit connected to said annunciator when a bulb head of a lamp is inserted into said second socket.

2. The testing apparatus according to claim 1, wherein said inductive circuit includes a 4069 chip having said plurality of individual power amplifiers connected in series.

3. The testing apparatus according to claim 1, wherein said annunciator includes an indicating light.

4. The testing apparatus according to claim 3, wherein said indicating lamp is a light emitting diode.

5. The testing apparatus according to claim 1, wherein said annunciator includes a buzzer.

6. The testing apparatus according to claim 1, wherein said battery comprises two AAA cells.

7. The testing apparatus according to claim 2, further comprising a third subcircuit connected to said battery and to said annunciator, said third subcircuit having a first electrode disposed at the outer surface of said housing and a second electrode disposed at the outer surface of said housing and spaced apart from said second electrode, wherein said third subcircuit includes a first conductor terminating at said first exposed electrode and a second conductor terminating at said second exposed electrode, and wherein said third subcircuit is provided to test fuses.

8. Testing apparatus for determining operability of lamps for lighting strings, comprising:
    a housing for containing circuitry and a battery, said housing having a first socket and a second socket formed therein and accessible from the exterior of said housing, for receiving lamps for testing;
    a battery for supplying power;
    an LED and buzzer for annunciating status of lamps being tested; and
    circuitry disposed to operate said LED and said buzzer, comprising
        a first subcircuit disposed to connect power from said battery to said first socket for direct contact with electrical conducting contact leads of a lamp,
        a second subcircuit including amplifiers disposed to establish an inductive circuit connected to said LED and said buzzer when a bulb head of a lamp is inserted into said second socket, and
        a third subcircuit connected to said battery and to said LED and said buzzer, said third subcircuit having a first electrode disposed at the outer surface of said housing and a second electrode disposed at the outer surface of said housing and spaced apart from said second electrode, wherein said third subcircuit includes a first conductor terminating at said first exposed electrode and a second conductor terminating at a second exposed electrode,
    wherein said inductive circuit includes a 4069 chip having plural individual power amplifiers connected in series, and said battery comprises two AA cells.

\* \* \* \* \*